(12) United States Patent
Lee

(10) Patent No.: US 7,692,226 B2
(45) Date of Patent: Apr. 6, 2010

(54) CMOS IMAGE SENSOR

(76) Inventor: Won-Ho Lee, 1 Hyangjeong-dong, Heungbuk-gu, Cheongju-si, Chungcheongbuk-do, 361-725 (KR)

( * ) Notice: Subject to any disclaimer, the term of this patent is extended or adjusted under 35 U.S.C. 154(b) by 126 days.

(21) Appl. No.: 11/644,937

(22) Filed: Dec. 26, 2006

(65) Prior Publication Data

US 2007/0145446 A1 Jun. 28, 2007

(30) Foreign Application Priority Data

Dec. 26, 2005 (KR) .................. 10-2005-0129438

(51) Int. Cl.
*H01L 31/062* (2006.01)
*H01L 31/113* (2006.01)
*H01L 27/10* (2006.01)
*H01L 29/73* (2006.01)
*H01L 31/06* (2006.01)

(52) U.S. Cl. .................. 257/292; 257/204; 257/206; 257/290; 257/291; 257/293; 257/294; 257/462; 257/E25.032; 257/E27.046; 257/E27.064; 257/E27.108

(58) Field of Classification Search .................. 257/204, 257/206, E25.032, E27.046, E27.064, E27.108, 257/290–294, 462
See application file for complete search history.

(56) References Cited

U.S. PATENT DOCUMENTS

| 6,514,785 | B1 * | 2/2003 | Chiang et al. .................. 438/48 |
|---|---|---|---|
| 6,541,329 | B1 * | 4/2003 | Chen et al. ................... 438/237 |
| 6,624,850 | B1 * | 9/2003 | Guidash ...................... 348/308 |
| 6,835,590 | B2 * | 12/2004 | Lee .............................. 438/69 |
| 6,881,992 | B2 * | 4/2005 | Lee et al. ..................... 257/292 |
| 6,943,051 | B2 * | 9/2005 | Augusto et al. ............... 438/58 |
| 6,967,121 | B2 * | 11/2005 | Rhodes ......................... 438/73 |
| 7,242,043 | B2 * | 7/2007 | Ohkawa ...................... 257/292 |
| 7,312,484 | B1 * | 12/2007 | Drowley et al. ............. 257/187 |
| 7,354,789 | B2 * | 4/2008 | Han ............................. 438/57 |
| 7,358,552 | B2 * | 4/2008 | Lee ............................. 257/292 |
| 2005/0231618 | A1 * | 10/2005 | Sugiyama ................... 348/273 |
| 2005/0237404 | A1 * | 10/2005 | Jerdev et al. ................ 348/303 |
| 2005/0243193 | A1 * | 11/2005 | Gove et al. .................. 348/241 |
| 2005/0248674 | A1 * | 11/2005 | Mabuchi et al. ............ 348/308 |
| 2006/0033828 | A1 * | 2/2006 | Lee .............................. 348/308 |
| 2006/0131481 | A1 * | 6/2006 | Hong ........................ 250/214.1 |
| 2006/0138489 | A1 * | 6/2006 | Ahn et al. .................... 257/292 |
| 2006/0138581 | A1 * | 6/2006 | Ladd ........................... 257/462 |
| 2007/0057298 | A1 * | 3/2007 | Mouli ......................... 257/292 |

FOREIGN PATENT DOCUMENTS

| JP | 54122249 A * | 9/1979 |
|---|---|---|
| JP | 02-275645 | 9/1990 |
| KR | 2002-0057290 | 7/2002 |
| KR | 2003-0060601 | 7/2003 |
| KR | 10-2004-0093852 | 11/2004 |
| KR | 2005-0060648 | 6/2005 |

* cited by examiner

*Primary Examiner*—Ida M Soward
(74) *Attorney, Agent, or Firm*—McAndrews, Held & Malloy, Ltd.

(57) ABSTRACT

A CMOS image sensor includes a photodiode, and a plurality of transistors for transferring charges accumulated at the photodiode to one column line, wherein at least one transistor among the plurality of transistors has a source region wider than a drain region, for increasing a driving current.

17 Claims, 20 Drawing Sheets

CMOS IMAGE SENSOR

FIELD OF THE INVENTION

The present invention relates to a semiconductor technology; and, more particularly, to a complementary metal oxide semiconductor (CMOS) image sensor.

DESCRIPTION OF RELATED ART

In recent years, a demand for a digital camera shows a tendency to explosively increase with the development of visual communication technology using an Internet. In addition, with an increasing supply of a mobile communication terminal such as a personal digital assistant (PDA), an international mobile telecommunications-2000 (IMT-2000), a code division multiple access (CDMA) terminal or the like, in which a camera is mounted, a demand for a miniature camera module increase accordingly.

The camera module includes an image sensor basically. In general, the image sensor is a device of converting an optical image into an electrical signal. As the image sensor, a charge coupled device (CCD) image sensor and a complementary metal oxide semiconductor (CMOS) image sensor are widely used.

The CCD image sensor, however, has several disadvantages: power consumption is too high; a manufacturing process is too complicated because of a plurality of masking processes; and the CCD image sensor is hardly manufactured in one chip because it is difficult to embody a signal processing circuit within the chip. On the contrary, since the CMOS image sensor can be manufactured such that control, drive and signal processing circuits are integrated into a monolithic integrated circuit within a single chip, it is looming large recently. Besides, in virtue of low voltage performance, low power consumption, compatibility with peripheral devices, usefulness of a standard CMOS manufacturing process, the CMOS image sensor requires relatively low manufacturing cost in comparison with the CCD image sensor.

However, in the CMOS image sensor, an analog signal generated by a light-receiving element such as a photodiode or the like, has various parasitic effects caused by parasitic capacitance, resistance, dark current leakage, inconformity of semiconductor device characteristic, etc. These parasitic effects, which inevitably occur in the semiconductor device, cause a signal to noise ratio of image data to be degraded after all. Therefore, the noise acts as an important factor that restricts the performance of the CMOS image sensor.

As causes for nose in the CMOS image sensor, for example, there is kt/C noise with regard to image data sampling, 1/f noise with regard to a circuit used for amplifying an image signal, fixed pattern noise (FPN) with regard to inconformity of the signal processing circuit in the image sensor. Among these, since the FPN is easily detected by user's eyes as it is represented as longitudinal lines or stripes, it looks terribly bad to user's eyes.

FIG. 1 is a schematic view of a conventional CMOS image sensor having a square shaped unit pixel.

Referring to FIG. 1, a row decoder 20 for decoding a row address is disposed at one side of a pixel array 10, and a column decoder 30 for decoding a column address. Herein, the column decoder 30 connected to outputs of pixel data is arranged in a predetermined direction perpendicular to the row decoder 20.

A procedure of reading data from the conventional CMOS image sensor having the above configuration will be set forth more fully as below.

When the row decoder 20 selects a first row, and the column decoder 30 then selects a first column, data of a corresponding selected pixel is read out and thereafter the data of the corresponding selected pixel is amplified. Afterwards, when the row decoder 20 selects a second row, and the column decoder 30 then selects a second column, data of a corresponding selected pixel is read out and thereafter the data of the corresponding selected pixel is amplified. In this manner, data for all pixels are read out.

There are various kinds of unit pixels used in the CMOS image sensor, of which one is a 3-transistor (3-T) structure configured with three transistors and one photodiode, another one is a 4-transistor (4-T) structure configured with four transistors and one photodiode, and the others.

FIG. 2 is a circuit diagram setting forth a typical 3-T structure among the various kinds of unit pixels for the conventional CMOS image sensor.

Referring to FIG. 2, a 3-T structured pixel includes one photodiode PD for converting photons into electrons and storing them, and three NMOS transistors. Herein, the three NMOS transistors are configured with a reset transistor Rx for resetting one end of the photodiode PD to a power voltage level VDD, a drive transistor Dx acting as a buffer amplifier configured as a source follower which is operated according to the charges accumulated at the photodiode PD, and a select transistor Sx for performing a switching operation for addressing.

FIG. 4 is a circuit diagram setting forth a typical 4-T structure among the various kinds of unit pixels for the conventional CMOS image sensor.

Referring to FIG. 4, a 4-T structured pixel includes one photodiode PD and four NMOS transistors. Herein, the four NMOS transistors are configured with a transfer transistor Tx for transferring photo-generated charges accumulated at the photodiode PD to a floating diffusion region FD, a reset transistor Rx for setting the floating diffusion region FD to a desired potential level and resetting the floating diffusion region FD by discharging the charges, and a drive transistor Dx acting as a buffer amplifier configured as a source follower which is operated according to the charges stored at the floating diffusion region FD, and a select transistor Sx for performing a switching operation for addressing.

As it is understood from FIGS. 2 and 4, a significant difference between the 3-T and 4-T structured pixels is whether or not the transfer transistor Tx and the floating diffusion region FD exist. The 3-T structured pixel detects a reset level by turning on the reset transistor Rx after detecting a signal level in advance, whereas the 4-T structured pixel detects a signal level by turning on the transfer transistor Tx after detecting a reset level by turning on the reset transistor Rx in advance.

Meanwhile, FIG. 3 is a circuit diagram of a pixel array in which the 3-T structured pixels of FIG. 2 commonly share one column line. Referring to FIG. 3, respective unit pixels UP1 to UPn are commonly connected to one column line so as to be connected to one load transistor Load.

FIG. 5 is a circuit diagram of a pixel array in which the 4-T structured pixels of FIG. 4 commonly share one column line. Referring to FIG. 5, respective unit pixels UP1 to UPn are commonly connected to one column line so as to be connected to one load transistor Load.

As shown in FIGS. 3 and 5, a plurality of 3-T or 4-T structured unit pixels are configured such that the plurality of pixels commonly share one column line and they are connected to one load transistor Load through the column line. Here, a signal is read out and outputted for every column line, as illustrated in FIG. 1.

On this wise, since pixel data outputted from the plurality of pixels are read through one column line, a fixed noise pattern (FPN) occurs due to an offset difference generated in every pixel during the manufacturing process. One of causes for the FPN is a variation of a channel length caused by a variation of a final inspection critical dimension (FICD) of a gate electrode of an adjacent transistor, and a consequent variation of saturation current.

Currently, characteristics of a transistor to which 0.18 µm CMOS image sensor technology is applied is as below.

TABLE 1

| Kind of Transistor | W/L (µm) | Idsat (µA) | Idsat' (µA/µm) |
|---|---|---|---|
| Load Tr. | 2/2 | 256 | 128 |
|  | 2/4 | 139 | 70 |
|  | 4/2 | 506 | 124 |
| Dx & Sx Tr. | 0.25/0.35 | 150 | 600 |

Referring to FIGS. 6A and 6B, and the table 1, the conventional unit pixel is designed such that gate electrode lengths L of the drive and select transistors Dx and Sx are equal to each other. Accordingly, a driving current is about 150 µA at the drive and select transistors Dx and Sx, and about 260 µA at the load transistor Load.

In general, the driving current in driving the CMOS image sensor is determined as a value corresponding to the driving current of the drive or select transistor Dx or Sx, which has a minimum driving current. Therefore, the manufacturing process of the drive or select transistors Sx or Dx should be precisely controlled.

However, there occurs a problem that the FICD of the gate electrode is changed during etching process for defining the gate electrodes of the drive and select transistors Dx and Sx. This change of the FICD of the gate electrode makes the driving current to be varied, which leads to a column fixed pattern noise after all.

SUMMARY OF THE INVENTION

It is, therefore, an object of the present invention to provide an image sensor capable of solving a limitation in that a column fixed noise pattern is caused by a change of a final inspection critical dimension (FICD) of a gate electrode in a transistor constituting a unit pixel.

In accordance with an aspect of the present invention, there is provided a complementary metal oxide semiconductor (CMOS) image sensor including: a photodiode; and a plurality of transistors for transferring charges accumulated at the photodiode to one column line, wherein at least one transistor among the plurality of transistors has a source region wider than a drain region, for increasing a driving current.

In accordance with another aspect of the present invention, there is provided a CMOS image sensor including: a photodiode; and an active region connected the photodiode; and a plurality of gate electrodes perpendicular to the active region, wherein the active region has different widths in a region overlapped with at least one of the gate electrodes, for increasing a driving current.

The present invention changes a layout scheme of a transistor such that the transistor of a unit pixel has an asymmetric structure instead of a symmetric structure. That is, by selectively extending a source region of each transistor to improve a driving current in the unit pixel, it is possible to prevent the occurrence of a column fixed noise pattern.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Figure 1:
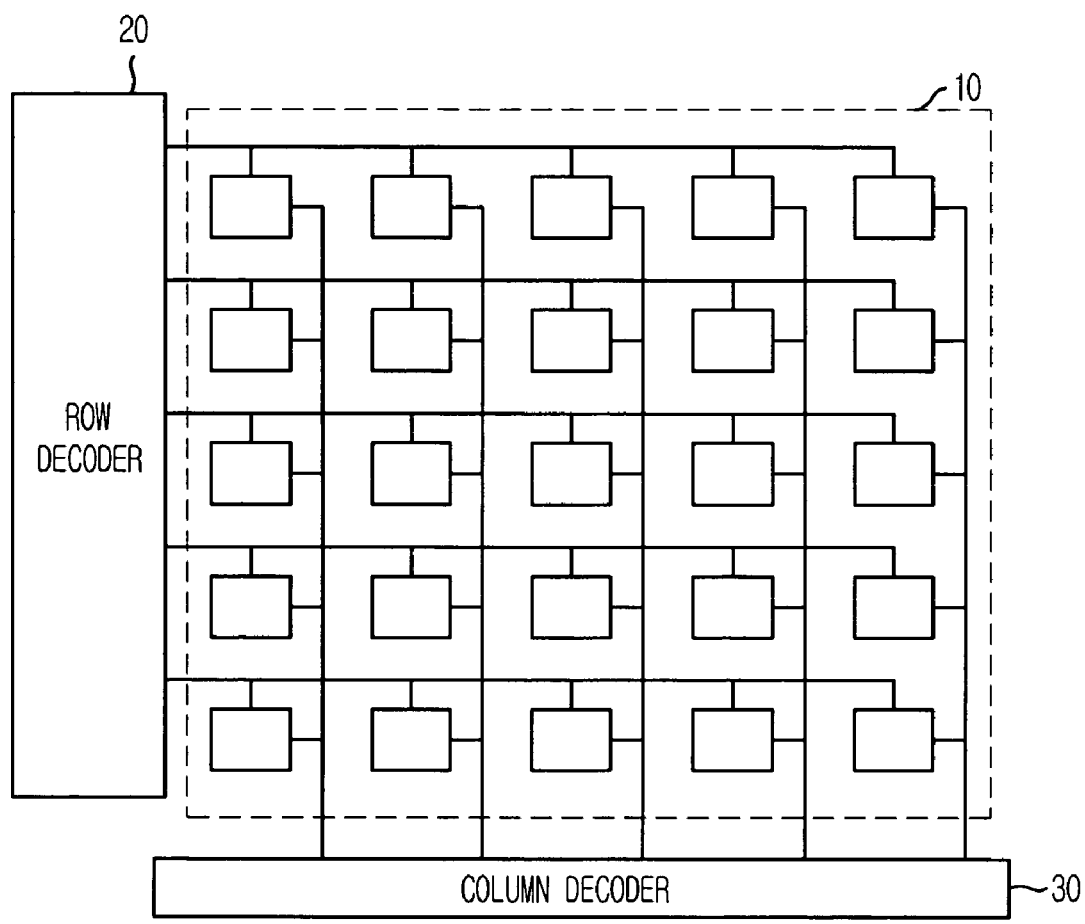
FIG. 1 is a schematic view of a conventional complementary metal oxide semiconductor (CMOS) image sensor having a square shaped unit pixel.
Figure 2:
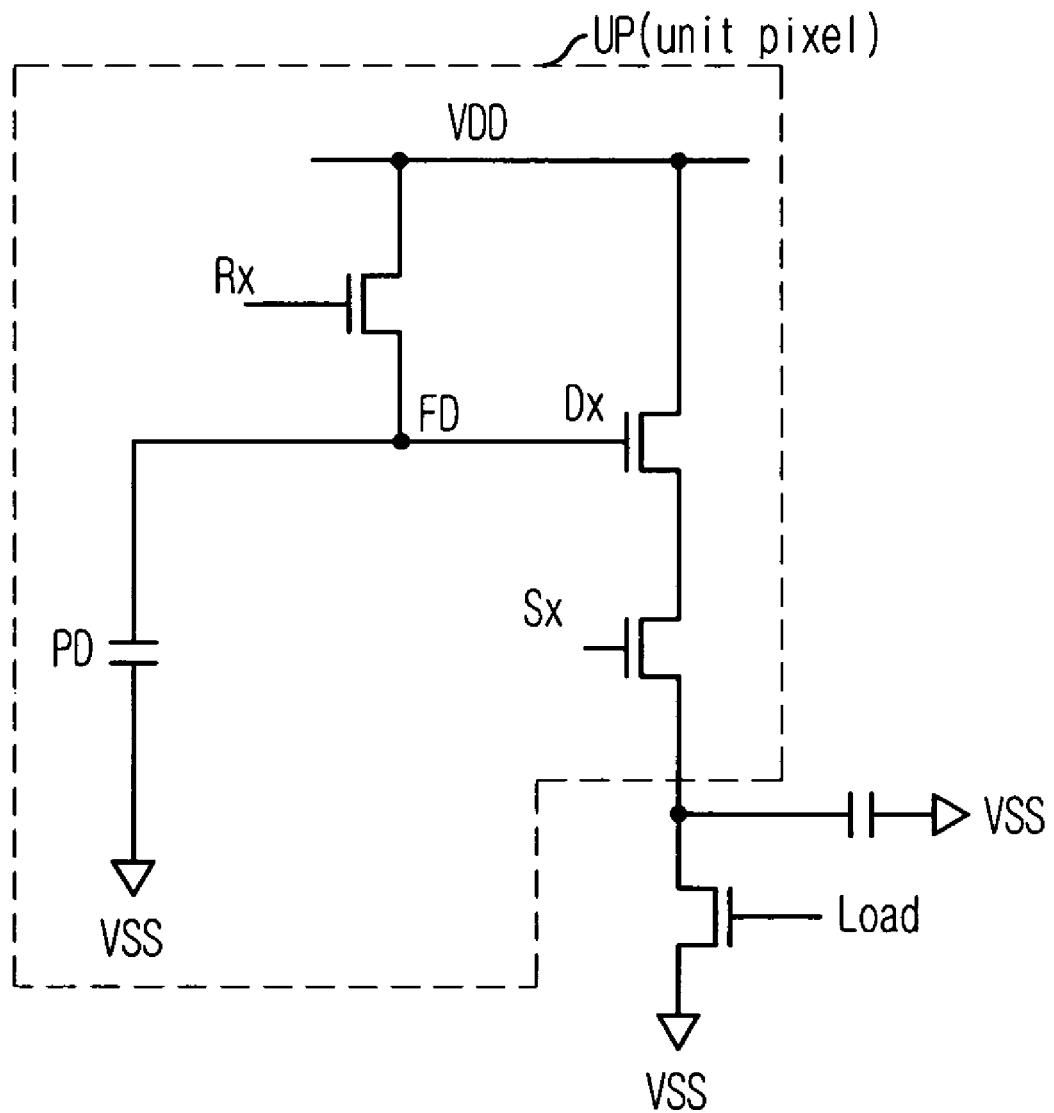
FIG. 2 is a circuit diagram setting forth a typical 3-T structure among the various kinds of unit pixels for the conventional CMOS image sensor.
Figure 3:
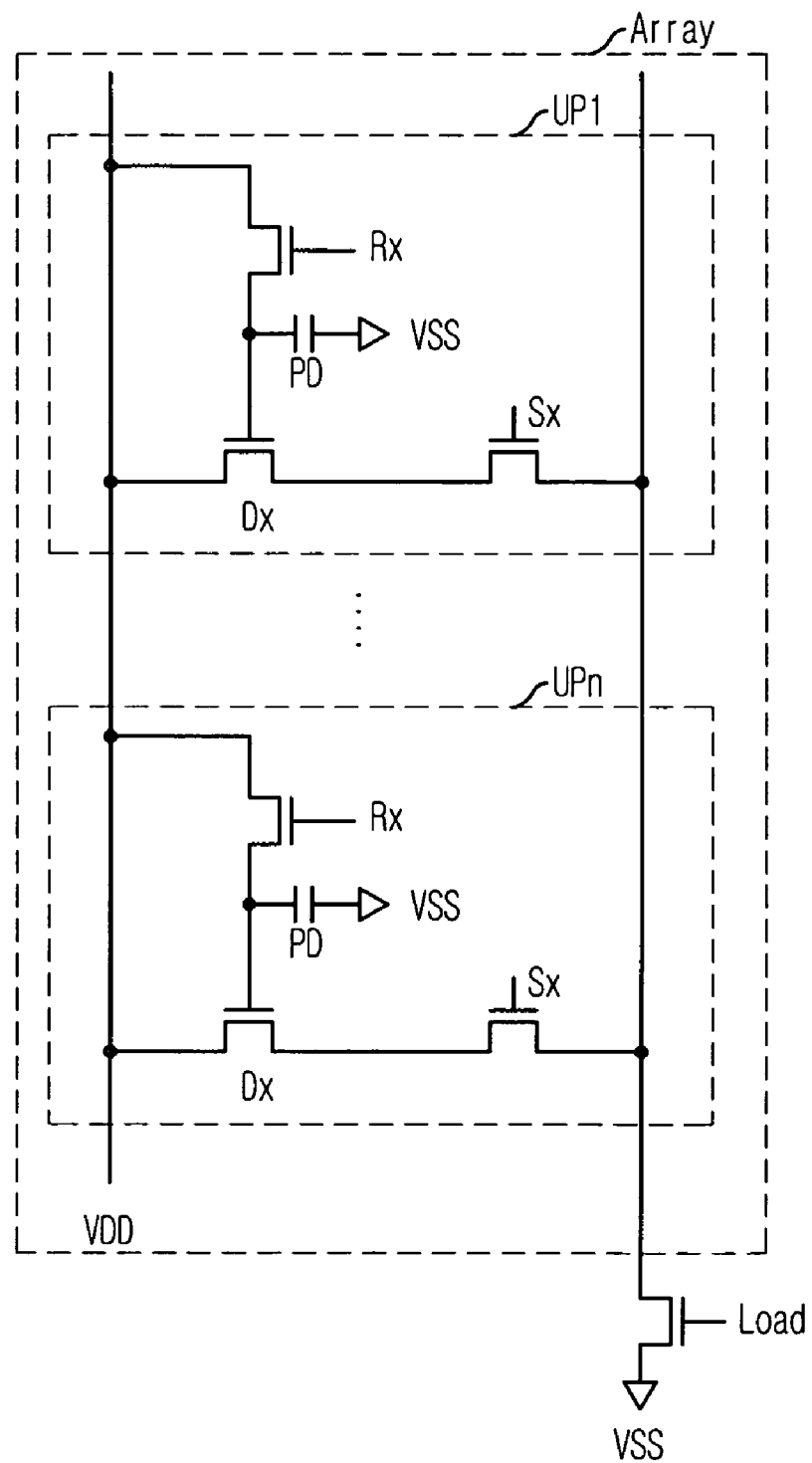
FIG. 3 is a circuit diagram of a pixel array in which the 3-T structured pixels of FIG. 2 commonly share one column line.
Figure 4:
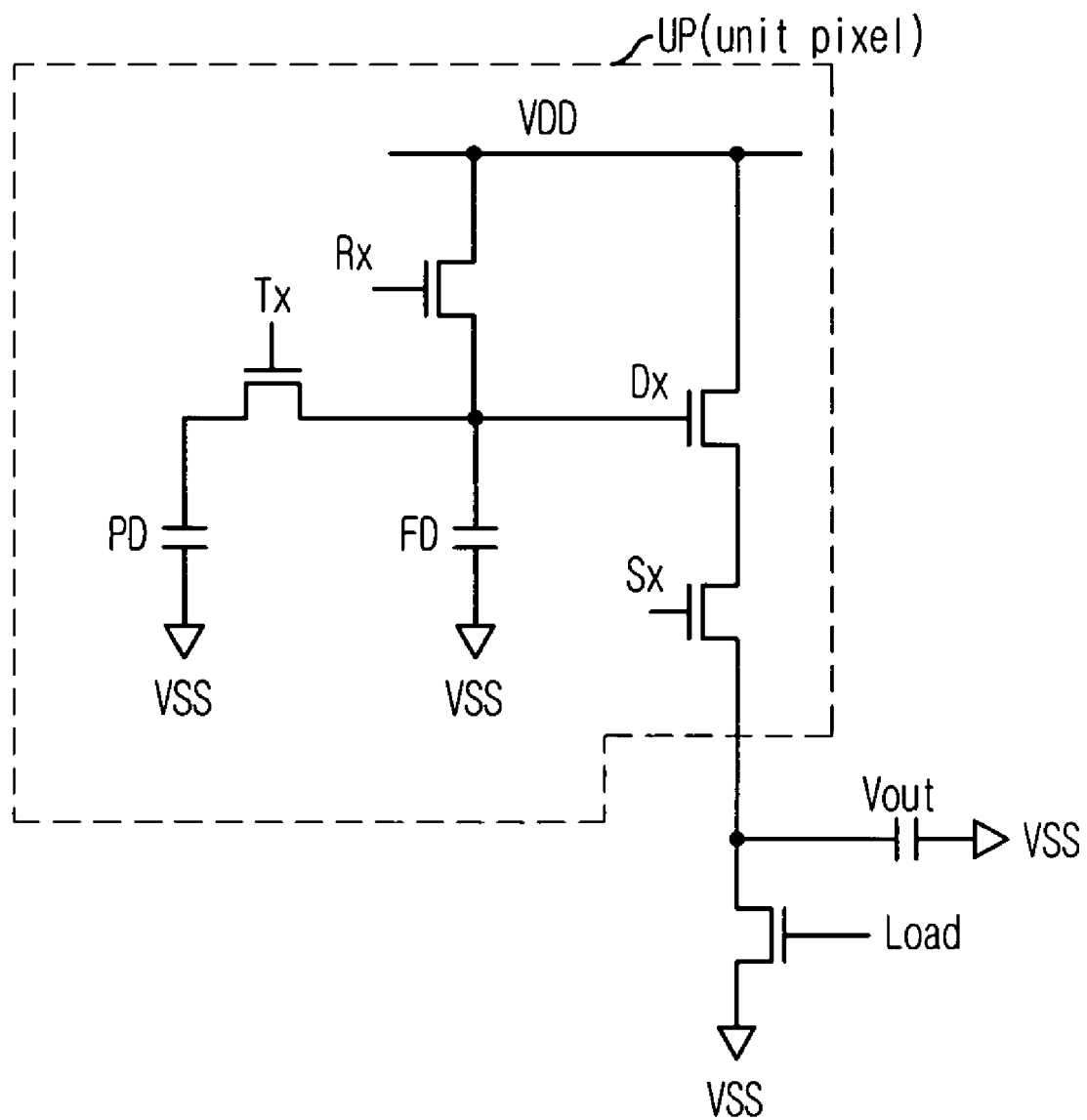
FIG. 4 is a circuit diagram setting forth a typical 4-T structure among the various kinds of unit pixels for the conventional CMOS image sensor.
Figure 5:
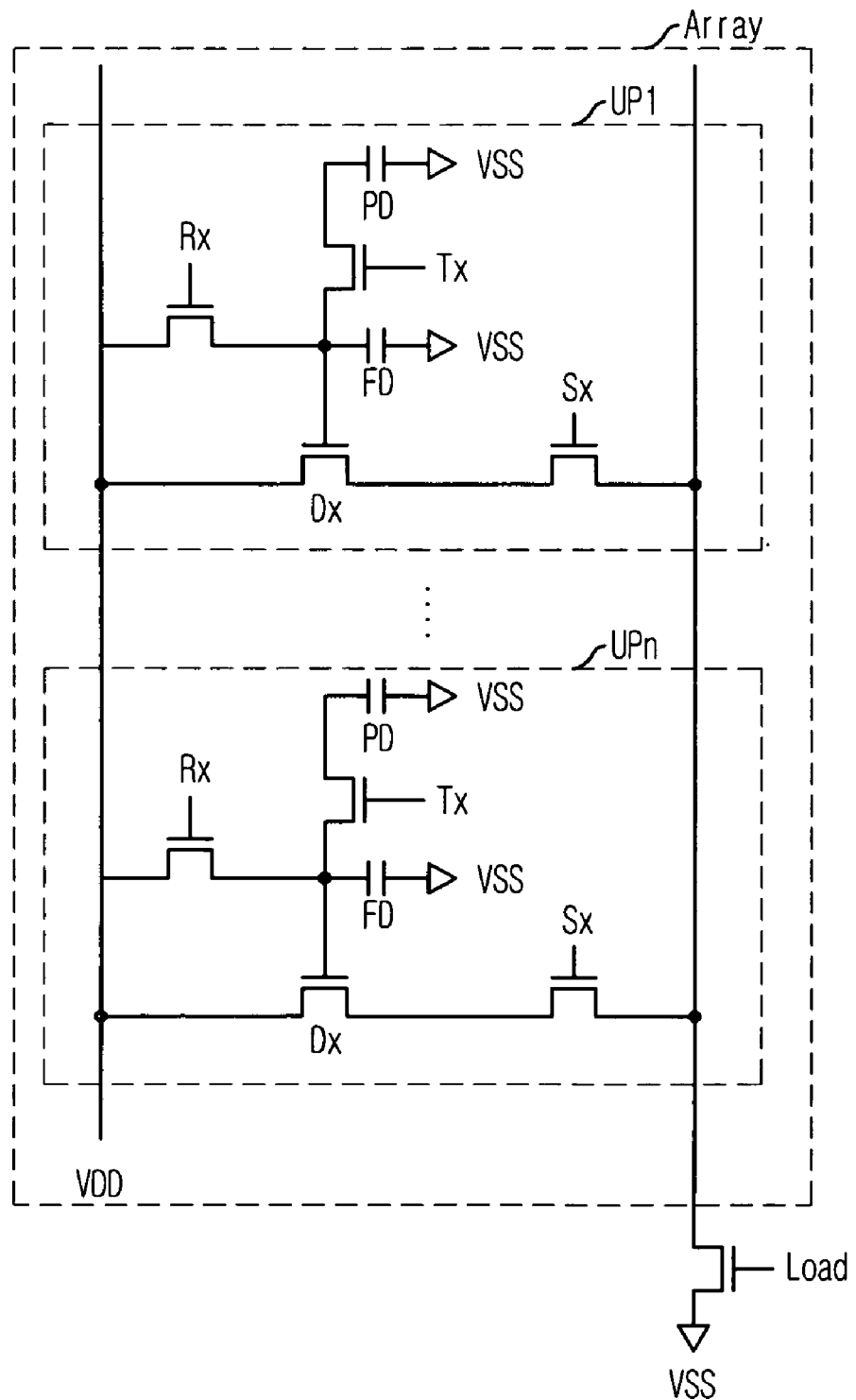
FIG. 5 is a circuit diagram of a pixel array in which the 4-T structured pixels of FIG. 4 commonly share one column line.
Figure 6A:
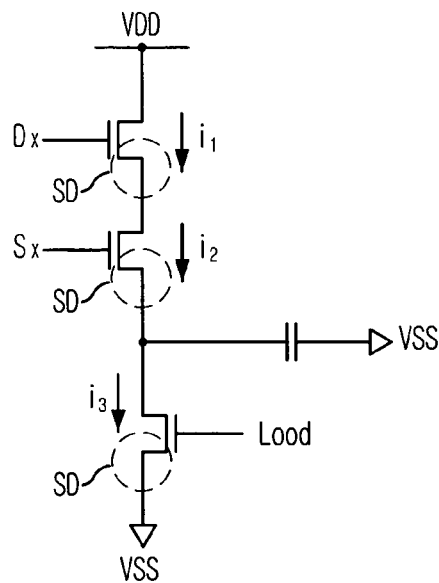
FIGS. 6A and 6B are a circuit diagram and a plane view illustrating a drive transistor and a select transistor of a unit pixel.
Figure 6B:
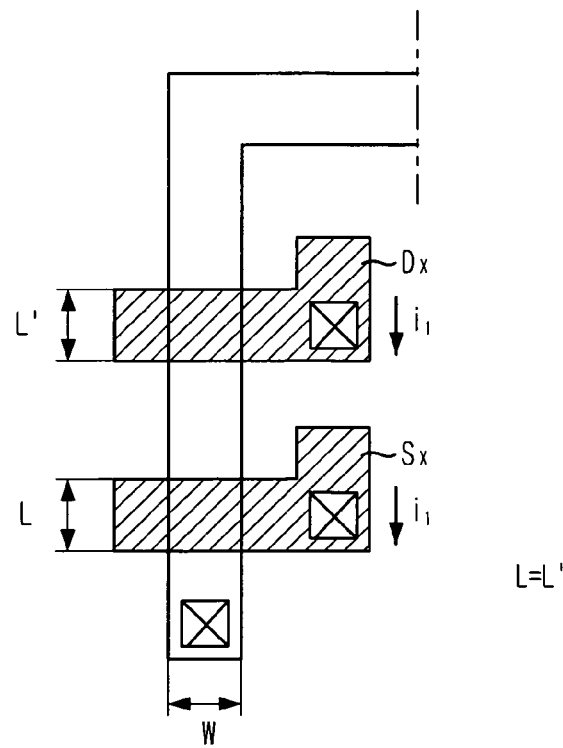

A complementary metal oxide semiconductor (CMOS) image sensor in accordance with exemplary embodiments of the present invention will be described in detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals in the drawings denote like elements.

Embodiment

Figure 7:
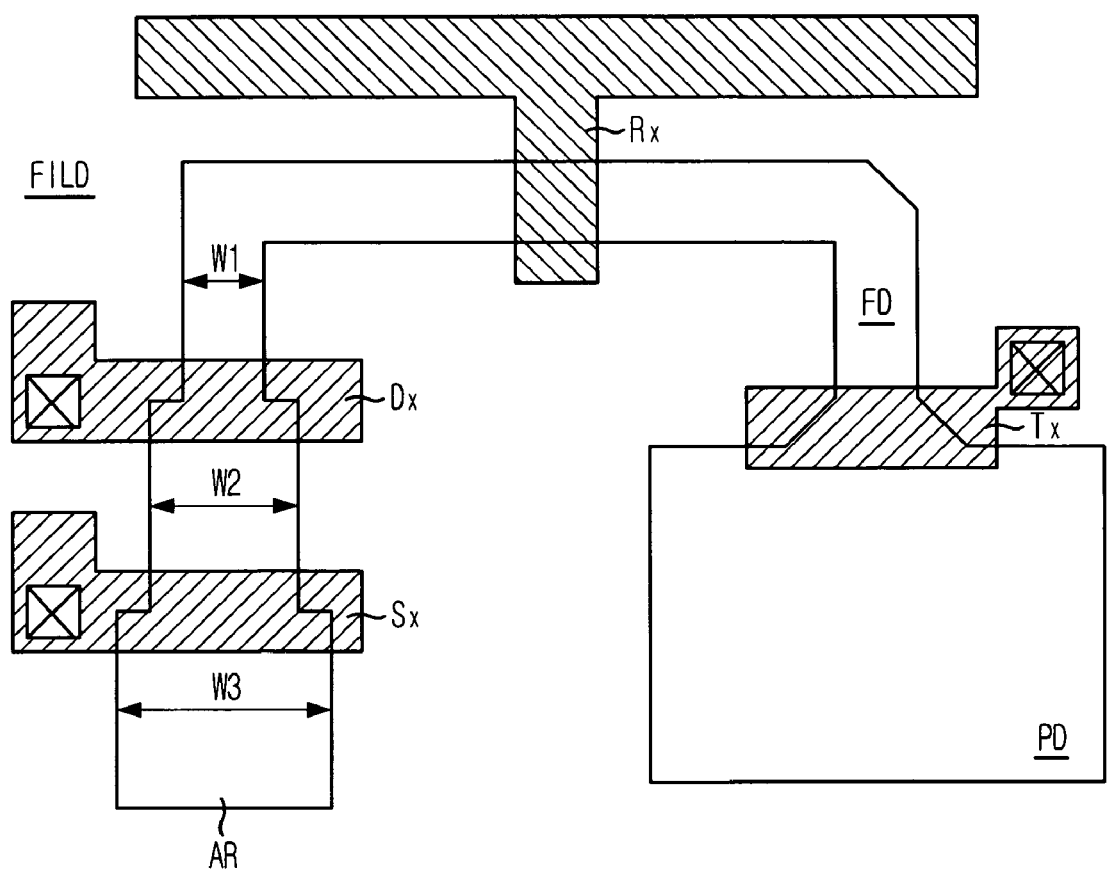
FIG. 7 is a plane view illustrating a unit pixel of a CMOS image sensor in accordance with one embodiment of the present invention.

FIG. 7 is a plane view illustrating a unit pixel of a CMOS image sensor in accordance with one embodiment of the present invention. Herein, a four-transistor (4-T) structured unit pixel is depicted in FIG. 7 for the sake of illustrative convenience.

Referring to FIG. 7, the unit pixel of the CMOS image sensor in accordance with one embodiment of the present invention is configured such that a width W3 of a source region of a select transistor Sx is greater than a width W2 of a drain region thereof, and the width W2 of a source region of a drive transistor Dx is greater than a width W1 of a drain region thereof. That is, the unit pixel of the inventive CMOS image sensor is formed such that an active region satisfies a predetermined inequality condition, i.e., W1<W2<W3.

A transistor current Itot of the CMOS image sensor of FIG. 7 may be expressed as a following equation 1.

$$Itot=Idsat[\mu A/\mu m]\times W[\mu m] \qquad [Eq.\ 1]$$

where the W denotes a channel width of a transistor

The current Itot flowing through the transistor is determined by the channel width W of the transistor, which can be calculated from Eq. 1. Therefore, the current flowing through each transistor may be controlled by adjusting the channel width W of each transistor, which makes it possible to remove a column fixed pattern noise caused by a variation of final inspection critical dimension (FICD) of a gate electrode. That is, the column fixed pattern noise caused by a variation of the FICD of the gate electrode in the CMOS image sensor can be removed when a saturation current becomes greater in a load transistor Load than a select transistor Sx, and a saturation current becomes greater in the select transistor Sx than a drive transistor Dx.

The relationship of saturation currents among the drive, select and load transistors Dx, Sx and Load in the unit pixel of FIG. 7 is expressed as a following inequality 1, in which denotations Idsat(Dx), Idsat(Sx) and Idsat(Load) represent the saturation current of the drive transistor Dx, the saturation current of the select transistor Sx, and the saturation current of the load transistor Load, respectively.

$$Idsat(Dx)<Idsat(Sx)<Idsat(\text{Load}) \qquad [Ineq.\ 1]$$

By forming the drive transistor Dx such that the width W2 of the source region is greater than the width W1 of the drain region, and forming the select transistor Sx such that width W3 of the source region is greater than the width W2 of the drain region, it is possible to remove the column fixed noise pattern caused by the variation of the FICD of the gate electrode.

Although FIG. 7 illustrates the structure where an active region AR is extended to either side thereof, i.e., bidirectionally, the present invention is not limited to this layout scheme but various structures may be applied to the inventive CMOS image sensor in order to increase the width of the active region AR.

The various structures for extending the active region AR will be illustrated with reference to FIGS. 8A to 8E, 9A to 9F, and 10A to 10F.

Figure 8A:
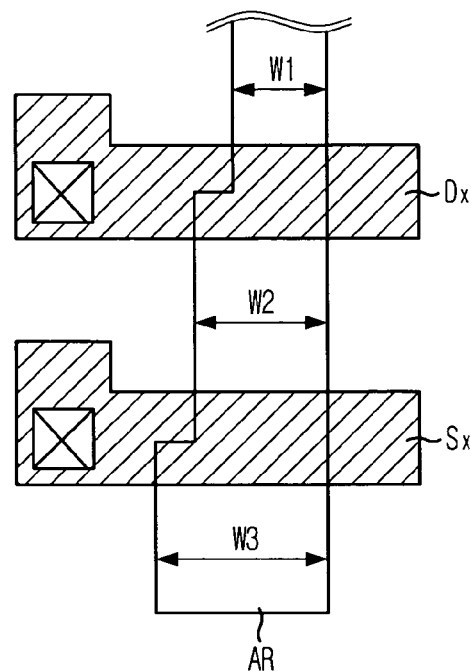
FIGS. 8A to 8E are plane views illustrating another unit pixel of the CMOS image sensor in accordance with one embodiment of the present invention.
Figure 8B:
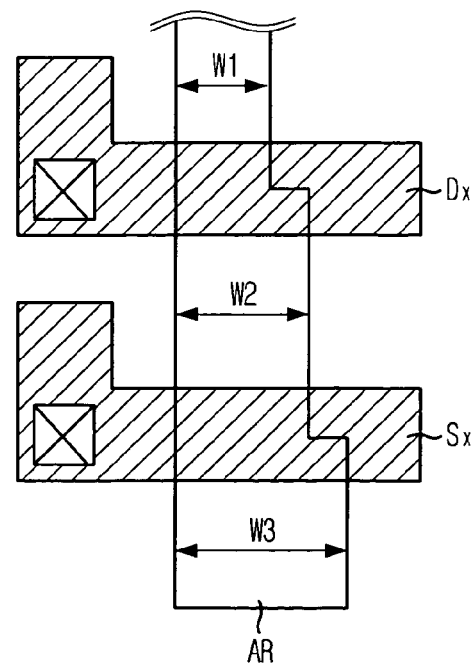
Figure 8C:
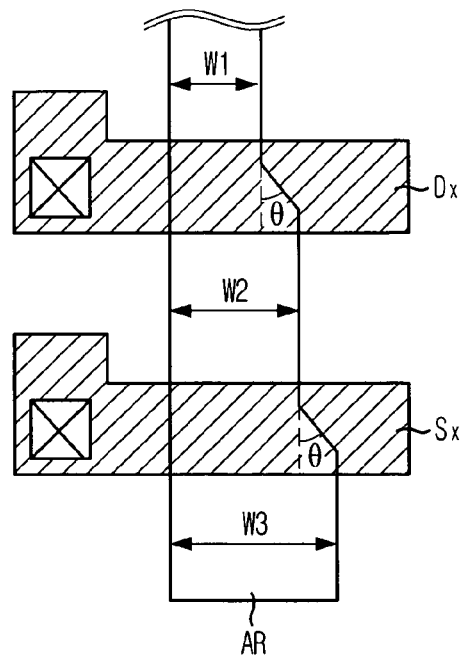
Figure 8D:
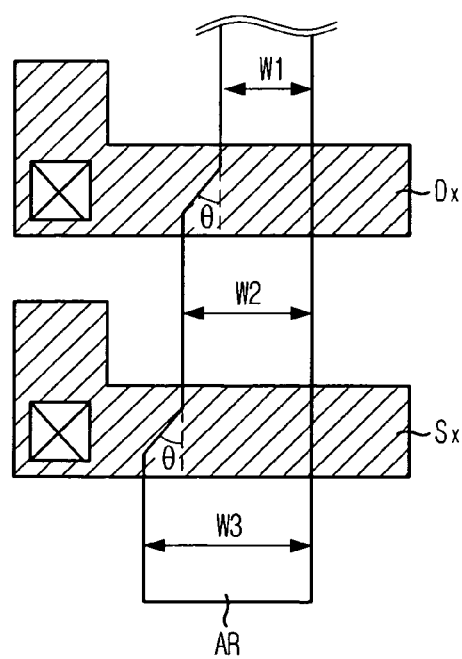
Figure 8E:
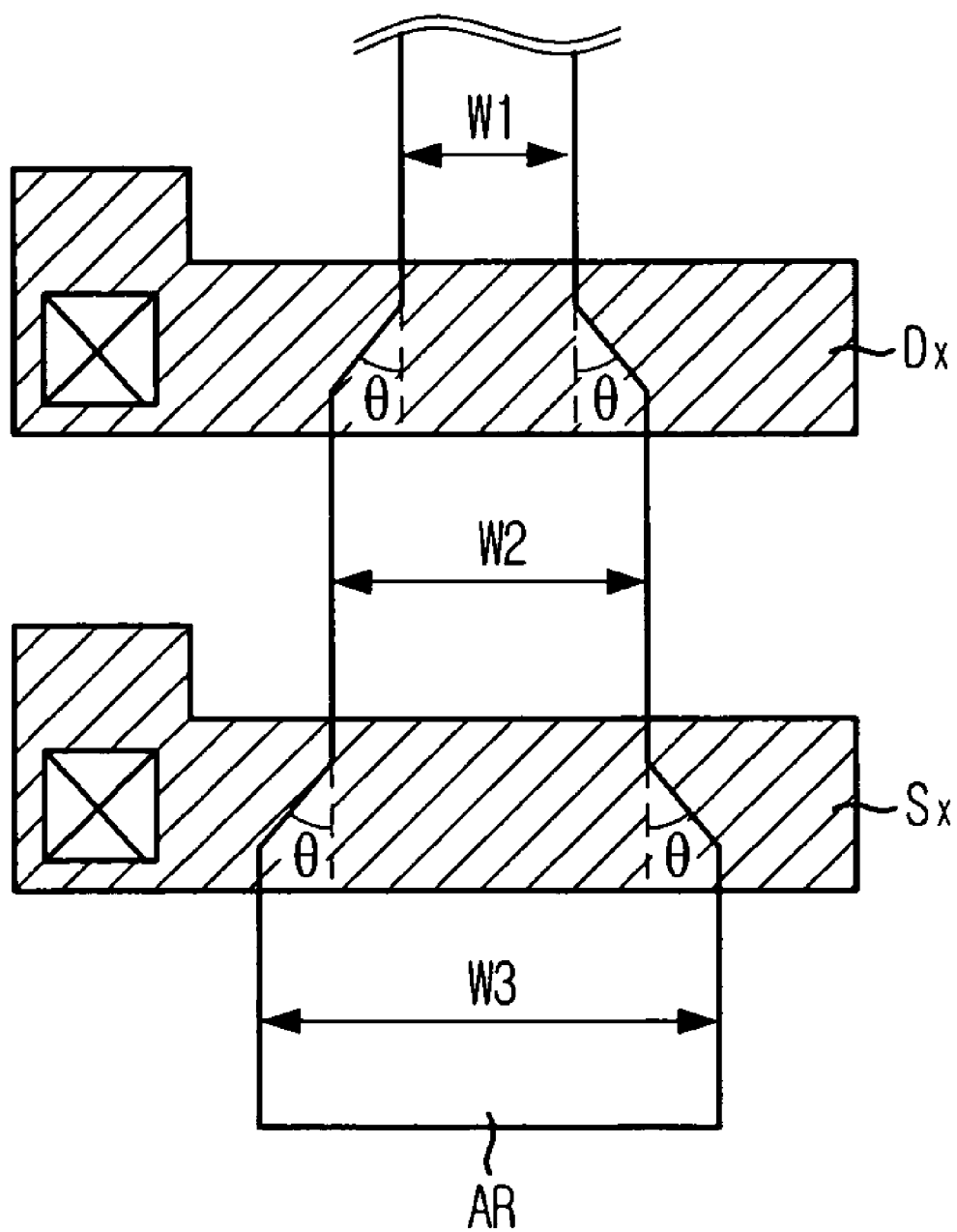
Figure 9A:
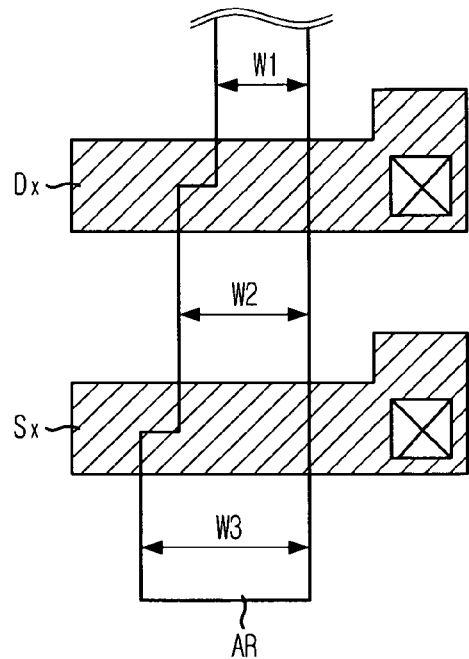
FIGS. 9A to 9F are plane views illustrating yet another unit pixel of the CMOS image sensor in accordance with one embodiment of the present invention.
Figure 9B:
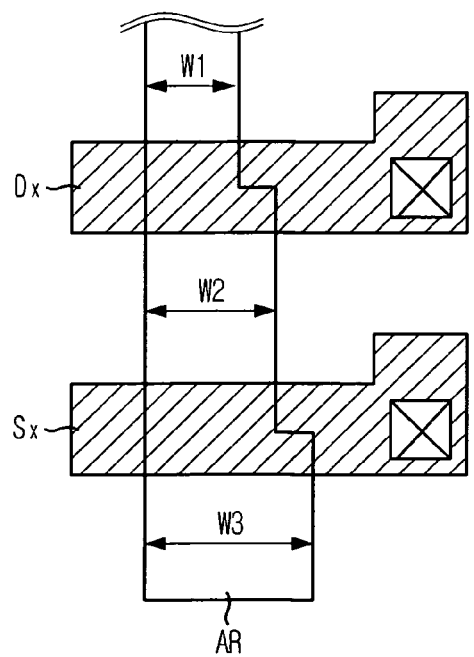
Figure 9C:
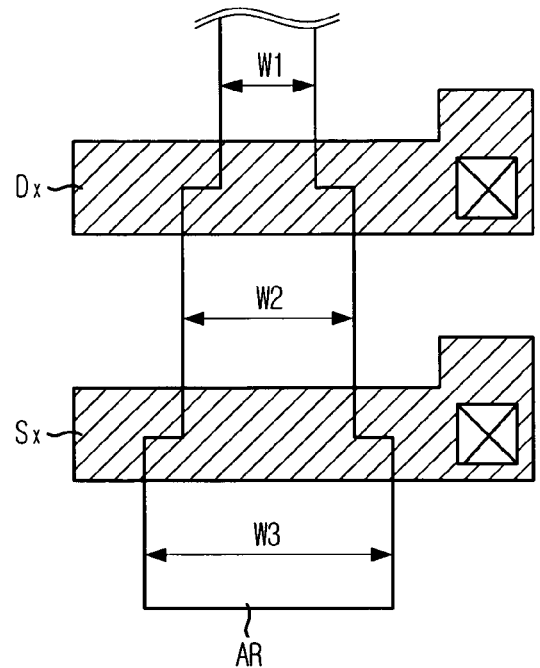
Figure 9D:
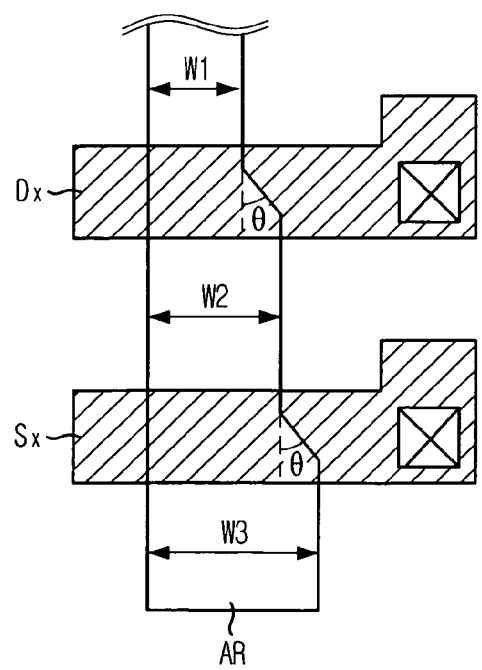
Figure 9E:
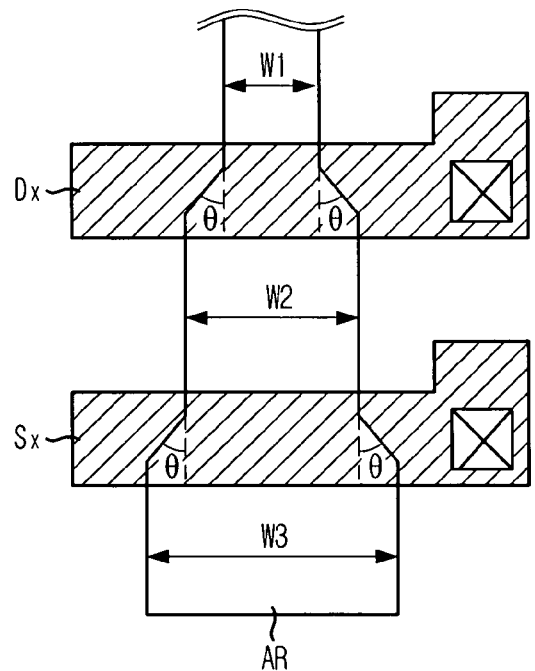
Figure 9F:
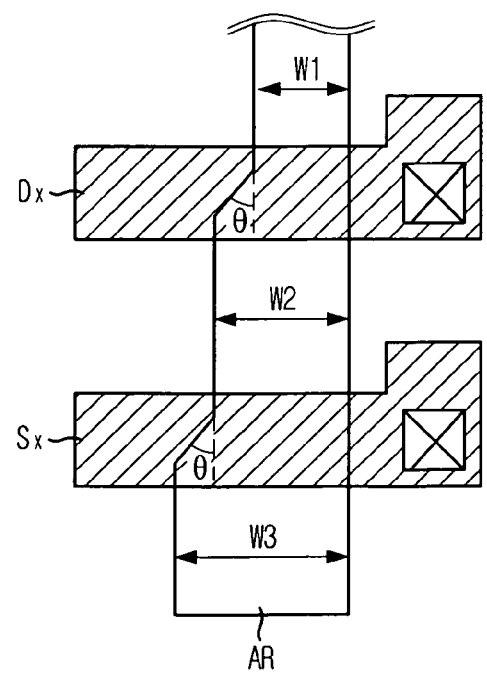
Figure 10A:
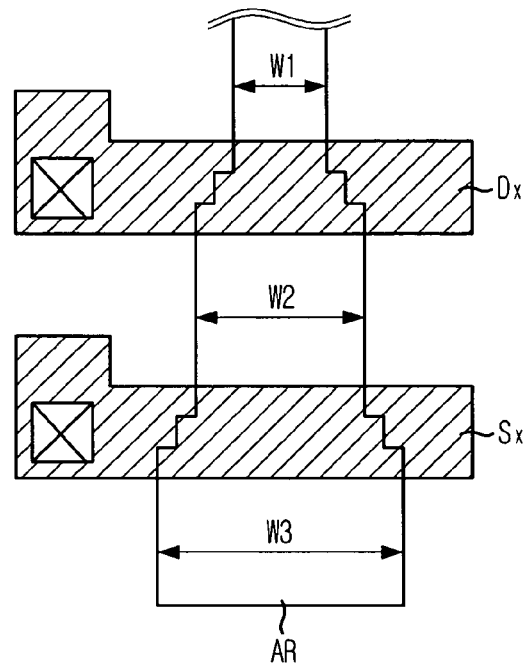
FIGS. 10A to 10F are plane views illustrating still another unit pixel of the CMOS image sensor in accordance with one embodiment of the present invention.
Figure 10B:
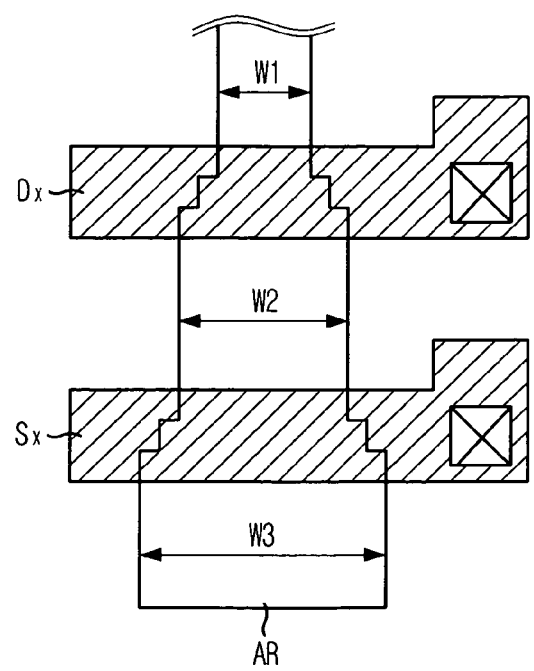
Figure 10C:
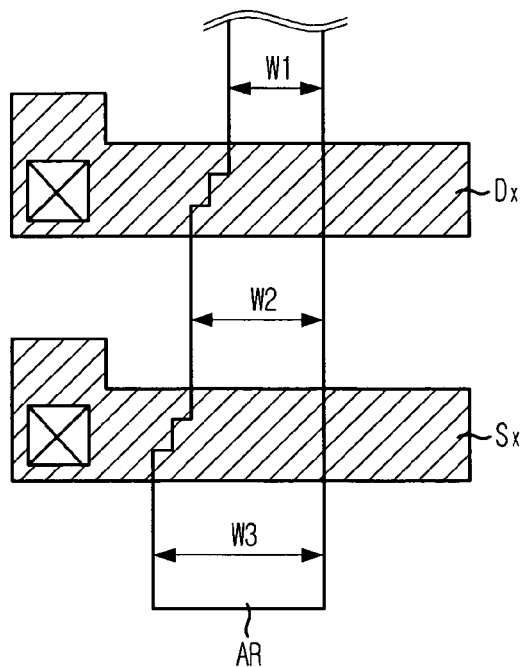
Figure 10D:
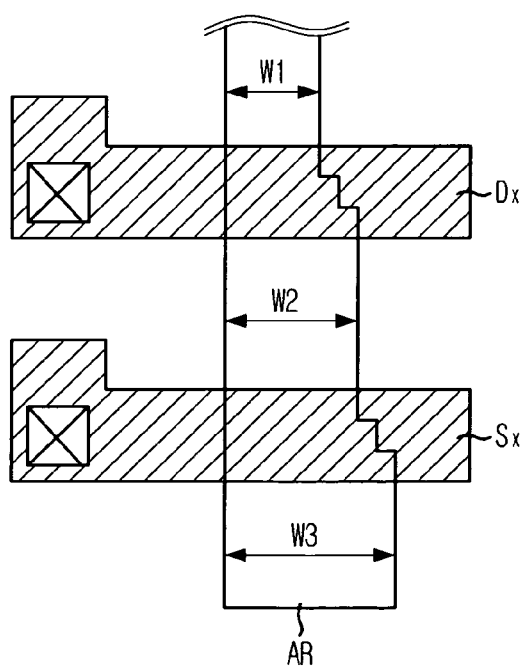
Figure 10E:
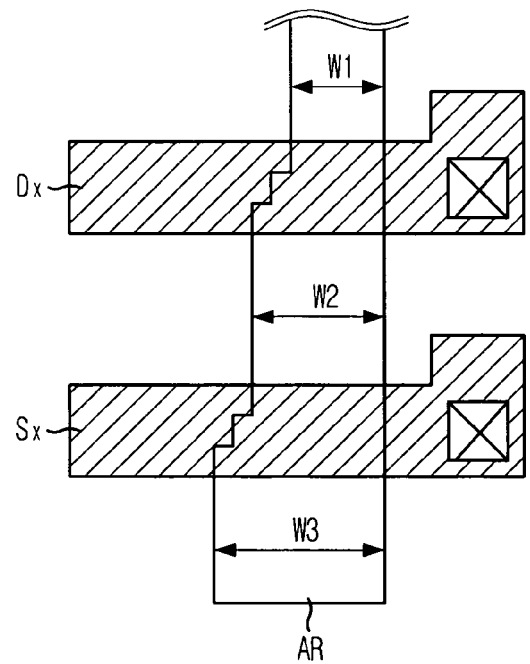
Figure 10F:
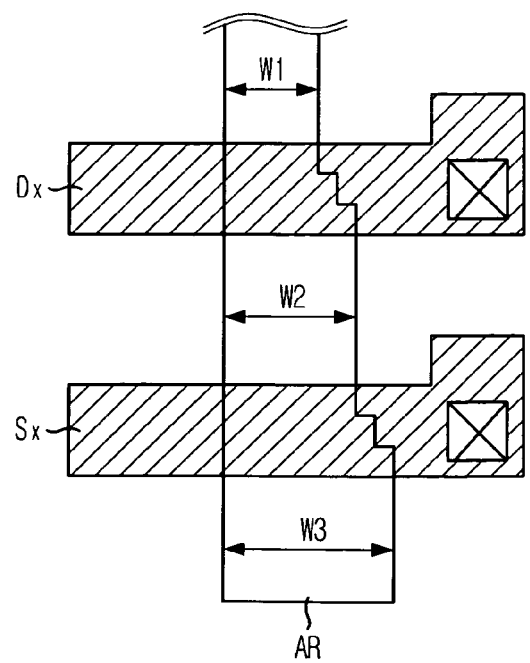

FIGS. 8A and 8B illustrate structures where the active region AR is extended to one side thereof, i.e., unidirectionally. That is, FIG. 8A shows the structure of which the active region is extended to a left side thereof, wherein the extended active region is perpendicular to the other active region. However, FIG. 8B shows the structure of which the active region is extended to a right side thereof, wherein the extended active region is also perpendicular to the other active region. Likewise, structures of FIGS. 8C and 8D have the active regions which are extended to one side thereof, but the extended active region is oblique with respect to the other active region. Herein, a tilt angle (θ) is greater than 0° and smaller than 90°, i.e., 0°<θ<90°. Meanwhile, FIG. 8E shows the structure of which the active region is extended to either side thereof, wherein the extended active regions are oblique to the other active regions as similar to FIGS. 8C and 8D.

Active regions AR illustrated in FIGS. 9A to 9F have the same extended structure as the active region AR of FIGS. 8A to 8E. However, contacts, which are marked as a capital letter X in the drawings, of the drive and select transistors Dx and Sx, are not disposed at portions far from the photodiode PD (see FIG. 7), but disposed at predetermined portions close to the photodiode PD. That is, the contacts of the drive and select transistors Dx and Sx of FIGS. 8A to 8E are disposed at left side of the active region AR, whereas the contacts of the drive and select transistors Dx and Sx of FIGS. 9A to 9F are disposed at right side of the active region AR.

FIGS. 10A to 10F illustrate a structure having an extended active region AR in shape of a step.

Meanwhile, although both the source regions of the drive and select transistors Dx and Sx are extended, this is only an exemplified one so that only the source region of the select transistor Sx may be extended. That is, the active region AR may be formed such that the width W1 may be equal to the width W2 but only the width W3 may be greater than the width W2. The reason is that the factor affecting the column fixed pattern noise is not determined by a combination of channel length variations of the drive and select transistors Dx and Sx but is determined by a single variable, i.e., only the channel length of the drive transistor Dx. This is beneficial to extend the source region of the select transistor Sx when it is difficult to extend the source region of the drive transistor Dx.

This is also effective for removing the factor affecting the column fixed noise pattern by increasing the characteristic of the select transistor Sx than the drive transistor Dx. Since the enhancement of the performance of the select transistor Sx is not resulted from the reduction of the channel length but the increase of channel width, it is possible to prevent the deterioration of characteristics such as off-current Ioff and breakdown voltage Bvdss. Generally, the off-current Ioff and the breakdown voltage Bvdss are factors which are greatly affected by the channel length.

Figure 11:
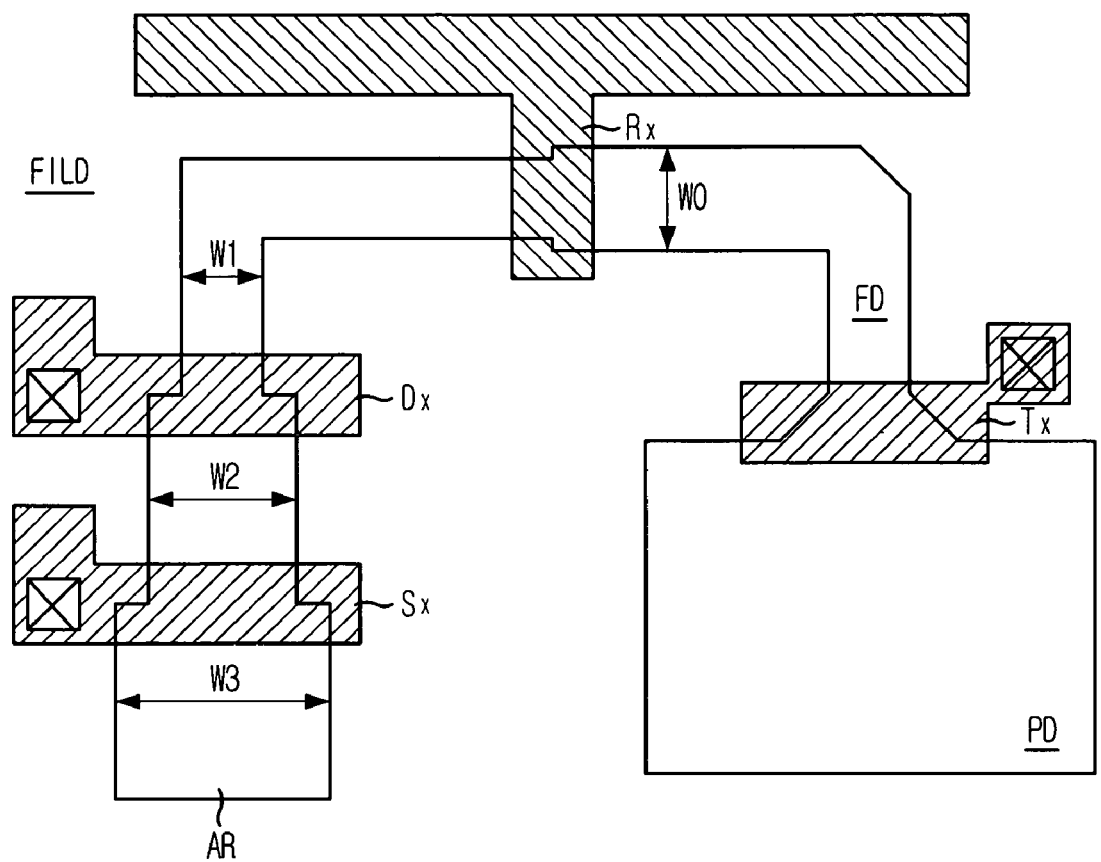
FIG. 11 is a plane view illustrating a unit pixel of a CMOS image sensor in accordance with another embodiment of the present invention.

FIG. 11 is a plane view illustrating an example that the enlarged scheme for the drive and select transistors Dx and Sx of FIG. 7 is applied to a layout scheme for the transfer and reset transistors Tx and Rx.

Referring to FIG. 11, widths of active regions where the transfer and reset transistors Tx and Rx are formed are reduced along the actual flow direction of electron.

That is, the transfer transistor Tx has a source region wider than a drain region, i.e., a width of the photodiode PD is greater than a width of the floating diffusion region FD. In addition, the reset transistor Rx has a source region W0 wider than a drain region W1. By changing the width of the active region, it is possible to improve the driving current characteristic. Further, in case of the transfer transistor Tx, it is expected that it is beneficial to secure charge capacity.

Specifically, when varying the widths of the active regions where the transfer and reset transistors Tx and Rx are formed, there are several advantageous merits as followings.

First, it is possible to improve the performance of the transfer transistor Tx because the carrier concentration increases with the area increase of the source region.

Figure 12A:
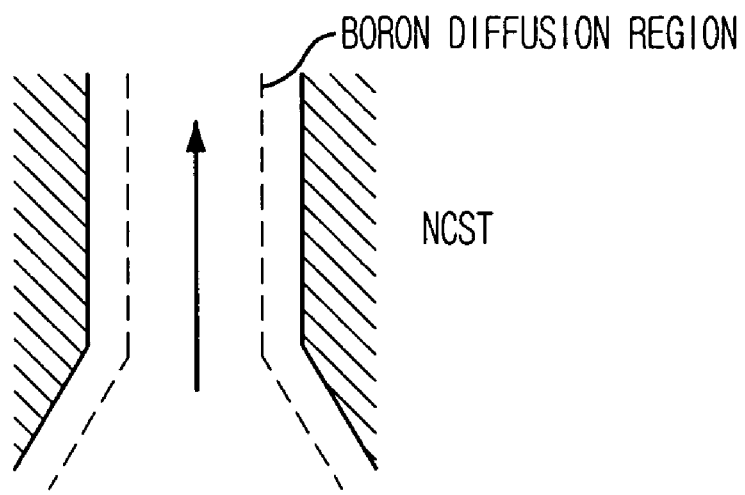
FIGS. 12A and 12B are concept views illustrating a technical principle of the unit pixel depicted in FIG. 11.
Figure 12B:
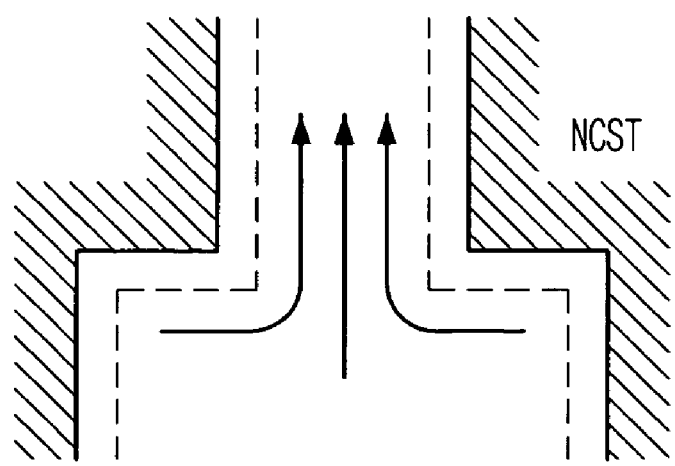

Second, in case of a pixel region, an n-channel stop layer NCST is formed on a field region FILD for isolating a dark current source caused by edge portions thereof by implant process as shown in FIG. 12. Boron (B11) diffuses into the active region through this process so as to deteriorate the transistor performance. Accordingly, by forming the transfer transistor Tx such that the source region is wider than the drain region, it is possible to prevent the transistor performance from being deteriorated.

Third, when the saturation current Idsat increases or decreases due to various process parameters and abnormal circumstances, the optical characteristic of the image sensor is degraded. In this case, the variation of the saturation current of the transistor may be prevented by forming the transfer transistor Tx such that the source region is wider than the drain region, which makes it possible to enhance uniformity. This technical principle may secure the uniformity of the saturation current in the structure of FIG. 12B rather than the structure of FIG. 12A.

Figure 13A:
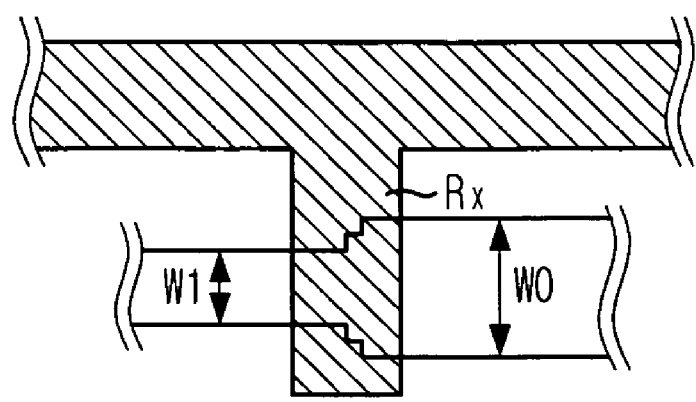
FIGS. 13A to 13D are plane views illustrating another unit pixel of the CMOS image sensor in accordance with another embodiment of the present invention.
Figure 13B:
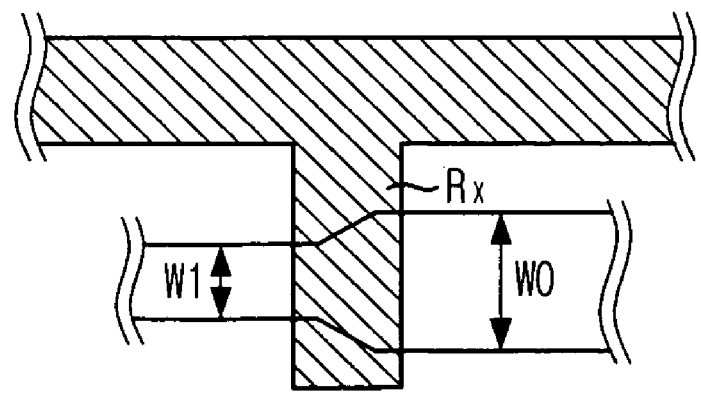
Figure 13C:
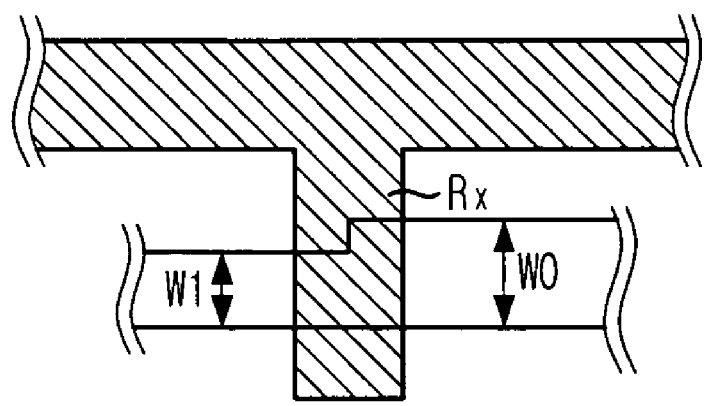
Figure 13D:
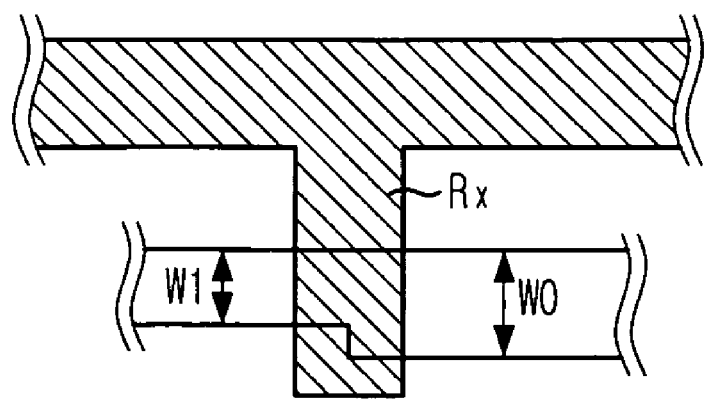

Various structures for increasing the source region of the reset transistor Rx are illustrated with reference to FIGS. 13A to 13D. Referring to FIG. 13A to 13D, the structure of FIG. 13A has a step-shaped structure which are extended bidirectionally, and the structure of FIG. 13B has an oblique structure which is extended bidirectionally, too. Herein, a tilt angle ($\theta$) is $0°<\theta<90°$. The structures of FIGS. 13C and 13D are extended unidirectionally. In detail, the structure of FIG. 13C has an active region of which an upper portion is extended unidirectionally, wherein the extended active region is perpendicular to the other active region. The structure of FIG. 13D has an active region of which a lower portion is extended unidirectionally, wherein the extended active region is perpendicular to the other active region.

As described above, in accordance with the present invention, it is possible to improve the driving current characteristic in the unit pixel, and further to remove the column fixed noise pattern, by forming the transistors such that the source region is selectively wider than the drain region.

The present application contains subject matter related to the Korean patent application No. KR 2005-129438, filed in the Korean Patent Office on Dec. 26, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A complementary metal-oxide semiconductor (CMOS) image sensor comprising:
   a photodiode; and
   a plurality of transistors configured to transfer charges accumulated at the photodiode to one column line;
   wherein at least one transistor among the plurality of transistors has a source region whose width is greater than that of a drain region adjacent to a gate electrode,
   wherein the plurality of transistors includes:
   a transfer transistor configured to switch charges accumulated at the photodiode to a floating diffusion region;
   a reset transistor configured to reset the floating diffusion region to a reset voltage;
   a drive transistor configured to amplify and output the charges accumulated at the floating diffusion region; and
   a select transistor configured to switch the signal amplified through the drive transistor to transfer the amplified signal to the column line; and
   wherein a source region of the drive transistor is configured to act as a drain region of the select transistor.

2. The CMOS image sensor of claim 1, wherein the floating diffusion region is configured to act as a source region of the reset transistor.

3. The CMOS image sensor of claim 1, wherein the transistor having the source region wider than the drain region is formed such that widths of a channel are different from each other under the gate electrode.

4. The CMOS image sensor of claim 3, wherein the channel is formed such that it has a protruded portion, of which at least one side is extended in a lengthwise direction of the gate electrode.

5. The CMOS image sensor of claim 3, wherein the channel is formed such that it has a step-shaped protruded portion, of which at least one side is extended in a lengthwise direction of the gate electrode.

6. The CMOS image sensor of claim 3, wherein the channel is formed such that it has an oblique protruded portion, of which at least one side is inclined at a tilt angle ($\theta$) with respect to a lengthwise direction of the gate electrode, wherein the tilt angle ($\theta$) is in a range of $0°<\theta<90°$.

7. A complementary metal-oxide semiconductor (CMOS) image sensor comprising:
   a photodiode;
   an active region connected to the photodiode; and
   a plurality of gate electrodes perpendicular to the active region;
   wherein the active region has different widths in a region overlapped with at least one of the gate electrodes;
   wherein the plurality of gate electrodes are included in a plurality of transistors respectively;
   wherein the plurality of transistors includes:
   a transfer transistor configured to switch charges accumulated at the photodiode to a floating diffusion region;
   a reset transistor configured to reset the floating diffusion region to a reset voltage;
   a drive transistor configured to amplify the charges accumulated at the floating diffusion region to output them; and
   a select transistor configured to switch the signal amplified through the drive transistor to transfer the amplified signal to the column line.

8. The CMOS image sensor of claim 7, wherein the floating diffusion region is configured to act as a source region of the reset transistor.

9. The CMOS image sensor of claim 7, wherein the source region of the drive transistor is configured to act as a drain region of the select transistor.

10. The CMOS image sensor of claim 7, wherein the active region is formed such that it has a protruded portion, of which at least one side is extended in a lengthwise direction of the gate electrode in the region overlapped with at least one of the gate electrodes.

11. The CMOS image sensor of claim 10, wherein the active region is formed such that it has a step-shaped protruded portion, of which at least one side is extended in a lengthwise direction of the gate electrode in the region overlapped with at least one of the gate electrodes.

12. The CMOS image sensor of claim 11, wherein the active region is formed such that it has an oblique protruded portion, of which at least one side is inclined at a tilt angle ($\theta$) with respect to a lengthwise direction of the gate electrode in the region overlapped with at least one of the gate electrodes, wherein the tilt angle ($\theta$) being is in a range of $0°<\theta<90°$.

13. A complementary metal-oxide semiconductor (CMOS) image sensor comprising:
   a photodiode; and
   a plurality of transistors configured to transfer charges accumulated at the photodiode to one column line;
   wherein at least one transistor among the plurality of transistors has a source region whose width is greater than that of a drain region adjacent to a gate electrode.

14. The CMOS image sensor of claim 13, wherein the transistor having the source region wider than the drain region is formed such that widths of a channel are different from each other under the gate electrode.

15. The CMOS image sensor of claim 14, wherein the channel is formed such that it has a protruded portion, of which at least one side is extended in a lengthwise direction of the gate electrode.

16. The CMOS image sensor of claim 14, wherein the channel is formed such that it has a step-shaped protruded portion, of which at least one side is extended in a lengthwise direction of the gate electrode.

17. The CMOS image sensor of claim 14, wherein the channel is formed such that it has an oblique protruded portion, of which at least one side is inclined at a tilt angle (θ) with respect to a lengthwise direction of the gate electrode, wherein the tilt angle (θ) is in a range of 0°<θ<90°.

* * * * *